US012621952B2

(12) United States Patent
Tunks et al.

(10) Patent No.: US 12,621,952 B2
(45) Date of Patent: May 5, 2026

(54) INFORMATION TECHNOLOGY RACK AMBIENT TEMPERATURE VISUALIZATION

(71) Applicant: Dell Products, L.P., Round Rock, TX (US)

(72) Inventors: Eric Michael Tunks, Austin, TX (US); Daniel Alvarado, Pflugerville, TX (US)

(73) Assignee: Dell Products L.P., Round Rock, TX (US)

( * ) Notice: Subject to any disclaimer, the term of this patent is extended or adjusted under 35 U.S.C. 154(b) by 491 days.

(21) Appl. No.: 17/812,718

(22) Filed: Jul. 14, 2022

(65) Prior Publication Data

US 2024/0023269 A1 Jan. 18, 2024

(51) Int. Cl.
H05K 7/14 (2006.01)
H05K 7/20 (2006.01)

(52) U.S. Cl.
CPC ....... H05K 7/1494 (2013.01); H05K 7/20836 (2013.01)

(58) Field of Classification Search
CPC .... H05K 7/1494; H05K 7/20836; H05K 3/12; H05K 3/1241; H05K 3/125; H05K 3/20; H05K 3/207; H05K 3/246; H05K 7/207; H05K 7/20945

USPC ......................................................... 454/184
See application file for complete search history.

(56) References Cited

U.S. PATENT DOCUMENTS

| | | | |
|---|---|---|---|
| 2012/0199542 A1* | 8/2012 | Knight | G01K 11/12 211/1 |
| 2018/0342181 A1* | 11/2018 | Nicholson, Jr. | G06K 7/1417 |
| 2022/0020248 A1* | 1/2022 | Crisp | H05B 47/115 |

FOREIGN PATENT DOCUMENTS

WO WO-2016185474 A1 * 11/2016 ............. G01K 11/12

* cited by examiner

*Primary Examiner* — Avinash A Savani
*Assistant Examiner* — Ryan L Faulkner
(74) *Attorney, Agent, or Firm* — Fogarty LLP

(57) ABSTRACT

A rack assembly for physically supporting information technology (IT) devices is disclosed. The rack assembly includes a plurality of interconnected panels forming a volumetric space having a front access and a rear access with opposing side panels. The front access and the rear access extend from a bottom edge to a top edge. The plurality of interconnected panels allow air to flow in either direction between the front access and the rear access. An ambient temperature indicator is mounted adjacent to the front access or the rear access. The ambient temperature indicator is configured to visually indicate temperature values between the top edge and the bottom edge.

15 Claims, 8 Drawing Sheets

INFORMATION TECHNOLOGY RACK AMBIENT TEMPERATURE VISUALIZATION

FIELD

The present disclosure generally relates to Information Handling Systems and, more particularly, to providing an ambient temperature indication on a rack for Information Handling Systems that is easily visualized and interpreted.

BACKGROUND

An Information Handling System (IHS) generally processes, compiles, stores, and/or communicates information or data for business, personal, or other purposes thereby allowing users to take advantage of the value of the information. IHSs may include a variety of hardware and software components that may be configured to process, store, and communicate information and may include one or more computer systems, data storage systems, and networking systems. Groups of IHSs may be housed within data center environments. A data center may include a large number of IHSs, such as server chassis that are stacked and installed within racks. A data center may include large numbers of such server racks that are organized into rows of racks. Administration of such large groups of IHSs may require teams of remote and local administrators working in shifts in order to support around-the-clock availability of the data center operations while minimizing any downtime.

As IHS components such as processors, graphics cards, random access memory (RAM), etc. have increased in clock speed and power consumption, the amount of heat produced by such components during normal operation has also increased. Often, the temperatures of these components need to be kept within a selected range to prevent overheating, instability, malfunction, and damage that would lead to a shortened component lifespan and lowered datacenter reliability. Accordingly, cooling systems often been used in IHSs to cool certain components. To control the temperature of components of an IHS, an approach may include using a "passive" cooling system that serves to reject heat of a component to air driven by one or more system-level air movers (e.g., fans, blowers, etc.). A different approach may include using an "active" cooling system in which a heat-exchanging cold plate is thermally coupled to the IHS component, and a chilled fluid is passed through conduits internal to the cold plate to remove heat from that component.

SUMMARY

In various embodiments, a rack assembly for physically supporting information technology (IT) devices comprises a plurality of interconnected panels forming a volumetric space having a front access and a rear access with opposing side panels. The front access and the rear access extend from a bottom edge to a top edge. The plurality of interconnected panels allow air to flow in either direction between the front access and the rear access. An ambient temperature indicator is mounted adjacent to the front access or the rear access. The ambient temperature indicator is configured to visually indicate temperature values between the top edge and the bottom edge. The rack assembly may further comprise a door frame adjacent to the front access, and a door mounted in the door frame. The door may include a vented grille configured to allow the air to flow through the door. The ambient temperature indicator is mounted to the door frame in some arrangements. The ambient temperature indicator may alternatively be mounted on a side panel.

The ambient temperature indicator may comprise a temperature-sensitive ink or paint. The ambient temperature indicator may comprise a sticker that is affixed to the rack assembly. The ambient temperature indicator may comprise a plurality of individual stickers stacked from the bottom edge to the top edge, wherein each individual sticker configured to react to temperature by displaying indicia associated with a temperature or temperature range. The indicia may be a range of colors, shades, or tones associated with various temperatures or temperature ranges. The indicia may include a series of segments that change color at different temperatures. The indicia may be numerical values that are associated with particular temperatures or temperature ranges.

The ambient temperature indicator may comprise a continuous band of temperature-sensitive ink or paint extending from the bottom edge to the top edge of the rack. Localized regions of the ambient temperature indicator may change colors based upon the temperature in each region.

The temperature values may correspond to a temperature of air flowing past the ambient temperature indicator, air flowing into the rack assembly, or air flowing out of the rack assembly in various embodiments.

An alternative rack assembly for physically supporting IT devices comprises a plurality of interconnected panels forming a volumetric space having a front access and a rear access with opposing side panels. The front access and the rear access extend from a bottom edge to a top edge. A door is mounted in the front access. The door includes a vented grille that is configured to allow the air to flow through the door and into the volumetric space. An ambient temperature indicator is mounted on the vented grille. The ambient temperature indicator is configured to visually indicate temperature values between the top edge and the bottom edge. The ambient temperature indicator may comprise a temperature-sensitive ink or paint.

The ambient temperature indicator may comprise a sticker that is affixed to the vented grille. The sticker may include a plurality of holes that are configured to align with holes in the vented grille. The sticker may include a temperature-sensitive ink or paint that changes color, shade, or tone at different temperatures.

The ambient temperature indicator may comprise a temperature-sensitive ink or paint applied to the vented grille, wherein localized regions of the change colors based upon the temperature in each region of the vented grille.

BRIEF DESCRIPTION OF THE DRAWINGS

The present invention(s) is/are illustrated by way of example and is/are not limited by the accompanying figures. Elements in the figures are illustrated for simplicity and clarity and have not necessarily been drawn to scale.

DETAILED DESCRIPTION

A data center may include a large number of IHSs that may be installed as components of a chassis. A rack structure may house several different chassis, and a data center may include numerous racks. The racks in data centers rely primarily on air cooling.

Figure 1:
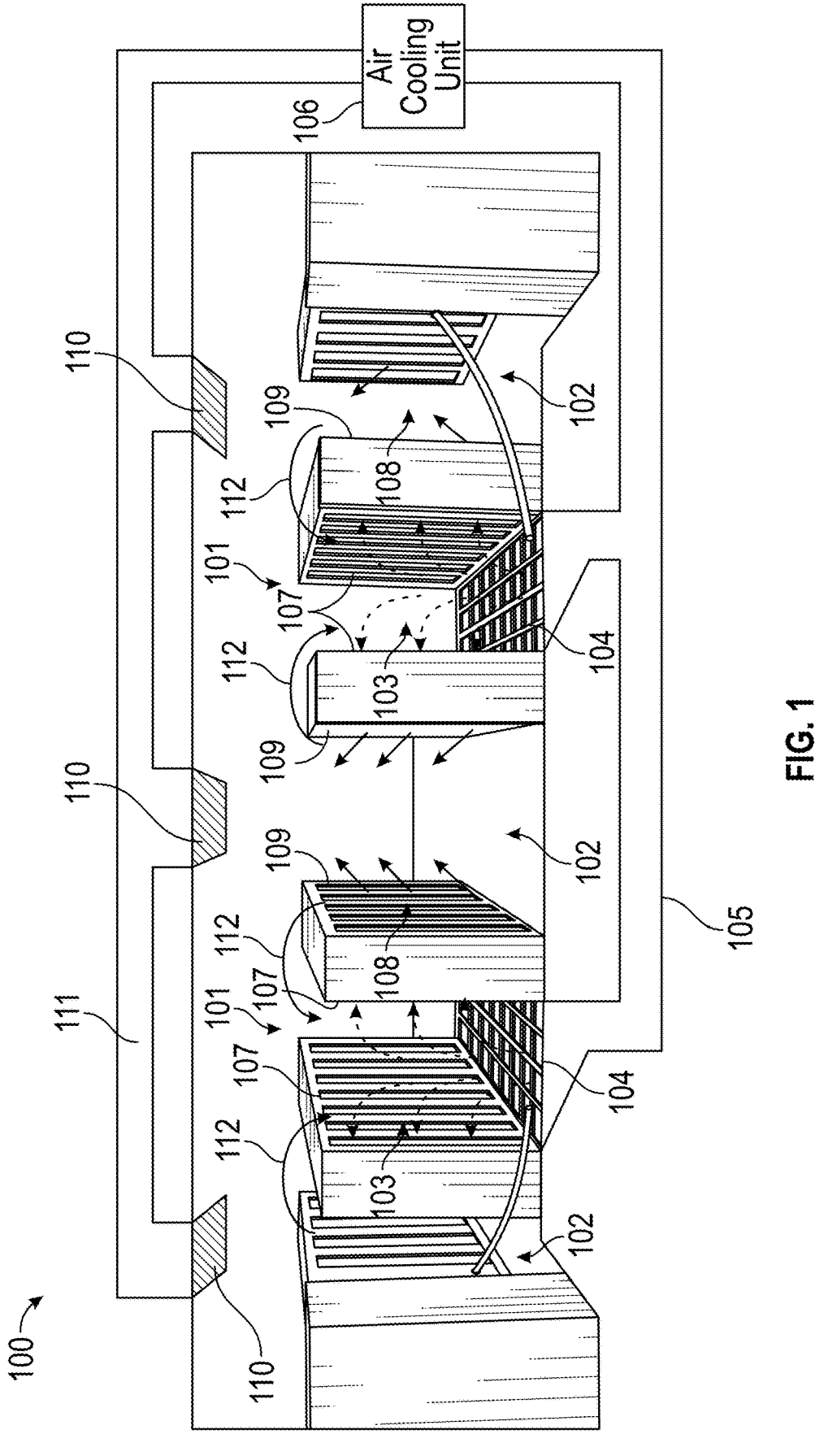
FIG. 1 is a block diagram illustrating a data center having a number of rows of racks that are arranged in alternating front-facing and back-facing rows.

FIG. 1 is a block diagram illustrating a data center 100 having a number of rows of racks that are arranged in alternating front-facing and back-facing rows. This creates alternating cold aisles 101 and hot aisles 102. In the cold aisles 101, chilled fresh air 103 typically enters from perforated floor tiles or vents 104 that are fed by supply ducts 105 from an air cooling unit 106, such as a dedicated HVAC system for the data center 101. The chilled air 103 is then drawn into the front side 107 of the racks. The chilled air 103 passes across the server chassis and/or other IHSs in the racks where the air is used to cool IHS components, such as processors, graphics cards, random access memory (RAM), etc. As a result, the air is heated up and hot air 108 is blown out the back side 109 of the racks into the hot aisles 102. The hot air is pulled into vents 110 and returned to the air cooling unit 106 via return vents 111 where the air is chilled again and recirculated to the data center 100.

Different containment mechanisms may be used to ensure that the airflow goes only where intended. The air cooling unit 106 should deliver an airflow amount sufficient to meet what the servers are consuming. The ambient air pressure in the cold aisles 101 should have a slightly higher pressure than the hot aisles 102. The term "ambient temperature" as used herein means a temperature associated with the immediate surroundings of a thing, object, or environment. Cold aisle containment may be used, such as by capping the cold aisles 101 so that all chilled air 103 is forced into the front side 107 of the racks. Alternatively, or additionally, hot aisle containment may be used to prevent hot air 108 from flowing back to the front side 107 of the racks.

Problems can arise in data center 100 when there is not enough cold air 107 being provided to the cold aisles 102. The IHSs in the racks can consume more airflow than is being provided through the floor vents 104. The racks then pull additional airflow from anywhere available. Usually, this additional airflow comes from the hot aisle 102 and flows over 112 or around the racks. As a result, servers may be pulling in significant a volume of hot air 112 instead of cold air 103, which could cause hotter component temperatures, higher fan speeds, or both. In other configurations, hot recirculated air 112 may pass over a rack ambient temperature sensor (not shown) although not significantly flowing into the rack itself. The rack will then misinterpret this as receiving hotter air than actually provided, which can result in excessive fan speeds and power consumption due to open loop thermal control. Additionally, the hot recirculated air 112 pass over the server ambient temperature sensor may result in a high ambient temperature warning.

Figure 2:
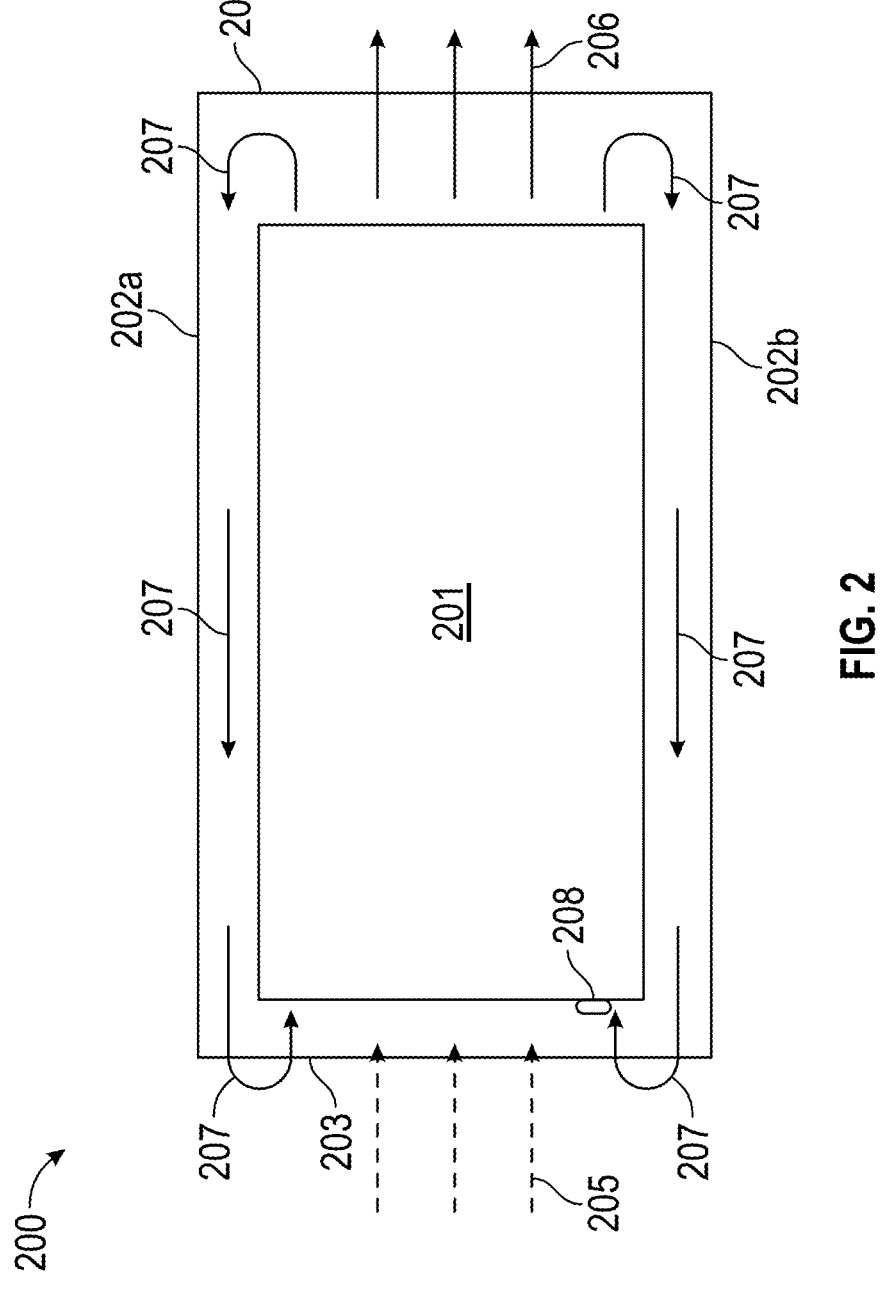
FIG. 2 is a block diagram illustrating another common recirculation path for a data center rack.

FIG. 2 is a top-view diagram illustrating another common recirculation path for a data center rack 200. A plurality of IHS devices 201, such as server chassis, are stacked in rack 200. The rack 200 has side walls 202*a,b*, a front side 203, and a back side 204. During normal cooling operation, cold air 205 is drawn into the front side 203 of rack 200. The cold air 205 passes over the components of the IHS devices 201 and is heated. Hot air 206 is exhausted out the back side 204 of rack 200.

When insufficient cold air 205 is provided at the front side 203 from the cold aisle, then the fans and other components in IHS devices 201 will pull additional air from other sources. One source of additional air is recirculated hot air 207 that flows between the sides 202*a,b* of rack 200 and the IHS devices 201 in the zero-U space. This recirculation may occur when there is not enough airflow being delivered to the cold aisle 203, and there is insufficient sealing between the IHS devices 201 and the sides 202*a,b* of the rack 200. This may not be enough airflow to significantly affect the overall temperature of the bulk airflow flowing through IHS devices 201; however, the recirculated air 207 may affect an ambient air sensor 208. This would cause fan speeds to be higher than necessary and/or trigger false ambient temperature warnings.

Figure 3:
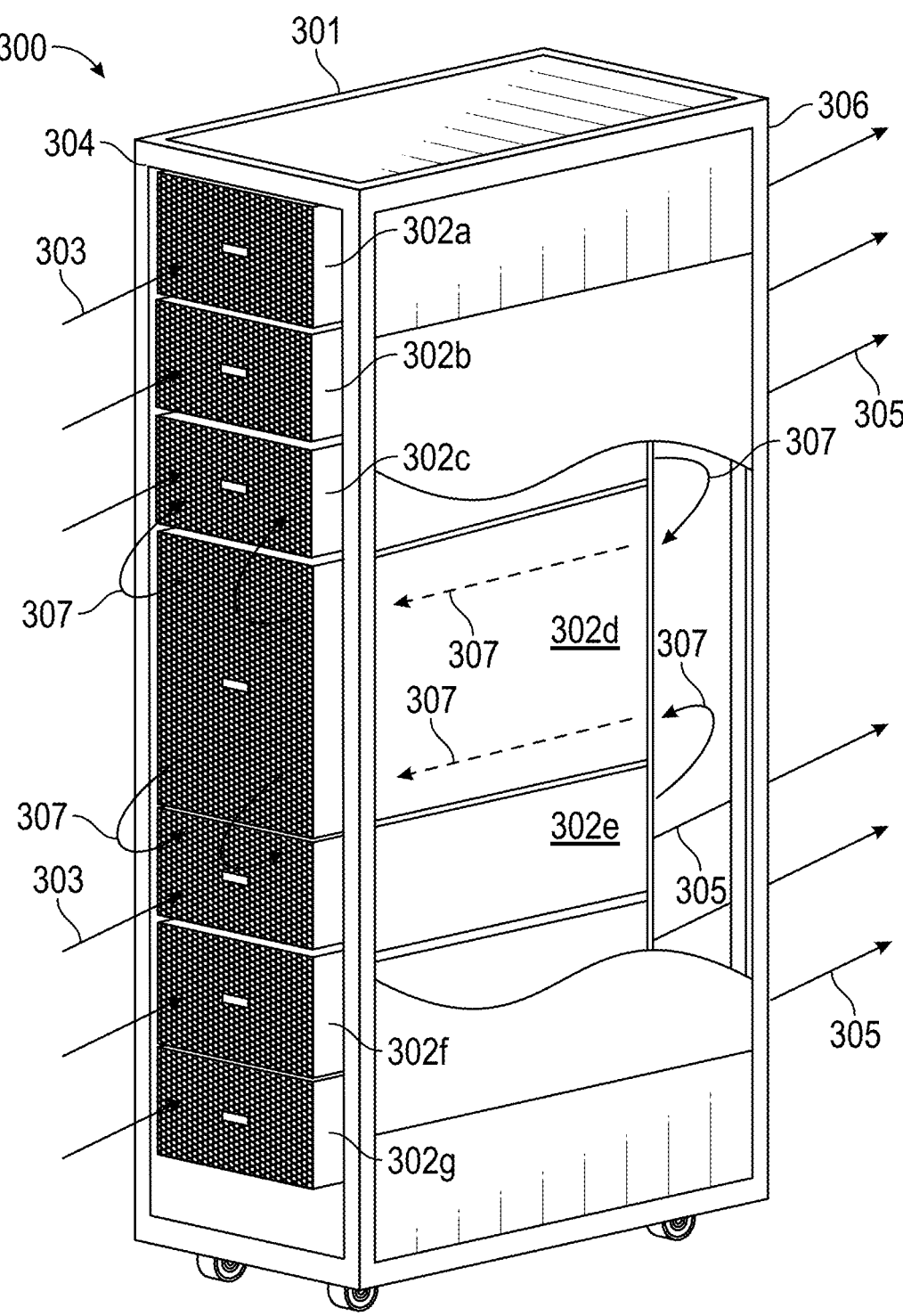
FIG. 3 is a diagram illustrating a further recirculation path for a data center rack.

FIG. 3 is a diagram illustrating a further recirculation path for a data center rack 300. The rack 300 may include a frame 301 and any number of data processing devices 302*a-g*. In one or more embodiments, the data processing devices 302*a-g* may include a chassis and one or more computing devices or IHSs disposed within the chassis. A chassis may be a mechanical device that is adapted to (i) facilitate attachment of the data processing device to the frame, (ii) house the one or more computing devices, and/or (iii) provide thermal management services to the computing devices. For example, a chassis may be a frame-mountable structure (e.g., a rectangular box) that includes internal space that may be used to house computing devices and/or IHS components that function as servers.

Frame 301 may be formed by a plurality of interconnected panels, such as side panels, top and bottom panels, and front and rear doors, vents, or screens. Frame 301 forms an internal volumetric space that may hold the chassis, computing devices, and/or IHSs, such as data processing devices 302*a-g*. These devices may be held in place using rails, shelves, or other mounting hardware (not shown). The plurality of interconnected panels allow air to flow in either direction between a front access and a rear access.

During typical operation, the data processing devices 302*a-g* generate heat and may be cooled using cold air 303 that flows into cold aisle side or front side 304 (e.g., a front access, such as an open space, vented door, screen, or grille) and is output as hot air 305 on hot aisle side or back side 306 (e.g., a rear access, such as an open space, vented door, screen, or grille).

If there is not enough cold aisle airflow 303, there could be a higher pressure on the hot aisle side 306 than on the cold aisle 304. This may occur even if there is hot or cold aisle containment in the data center. Such a pressure differential will force airflow through every available dead space from the hot aisle side 306 to the cold aisle side 304. In the event that one of the data processing devices is powered off or empty, such as data processing device 302*d*, for example, then the fans in that data processing device 302*d* would not be forcing air in the desired direction from the cold aisle side 304 to the hot aisle side 306. Instead, the pressure drop from the hot aisle side 306 to the cold aisle 304 will draw air "backwards" through data processing device 302d.

In this example, the servers in data processing device 302d are powered off. Air will flow from the hot aisle side 306 and recirculate 307 back into data processing device 302d, through the server, and out the front of the server. This hot airflow 307 may then get drawn into an adjacent data processing device 302c, 302e that is actually operating. This hot airflow 307 entering the adjacent data processing devices may cause insufficient cooling of those servers resulting in high component temperatures and/or excess fan speeds.

In typical data centers, an administrator may be presented with a rack temperature on a GUI display that aggregates server ambient temperatures. By monitoring server inlet temperatures in this way, an administrator may detect that some servers are seeing inlet temperatures higher than the cold aisle air supply temperature, which could be used as an indicator that there is a problem. However, this requires that all the servers are connected to a management system and aggregated to show all the server inlets together in the same view. Moreover, this monitoring solution cannot be observed in-person at the server or rack itself but must be seen using a connected management system.

Figure 4A:
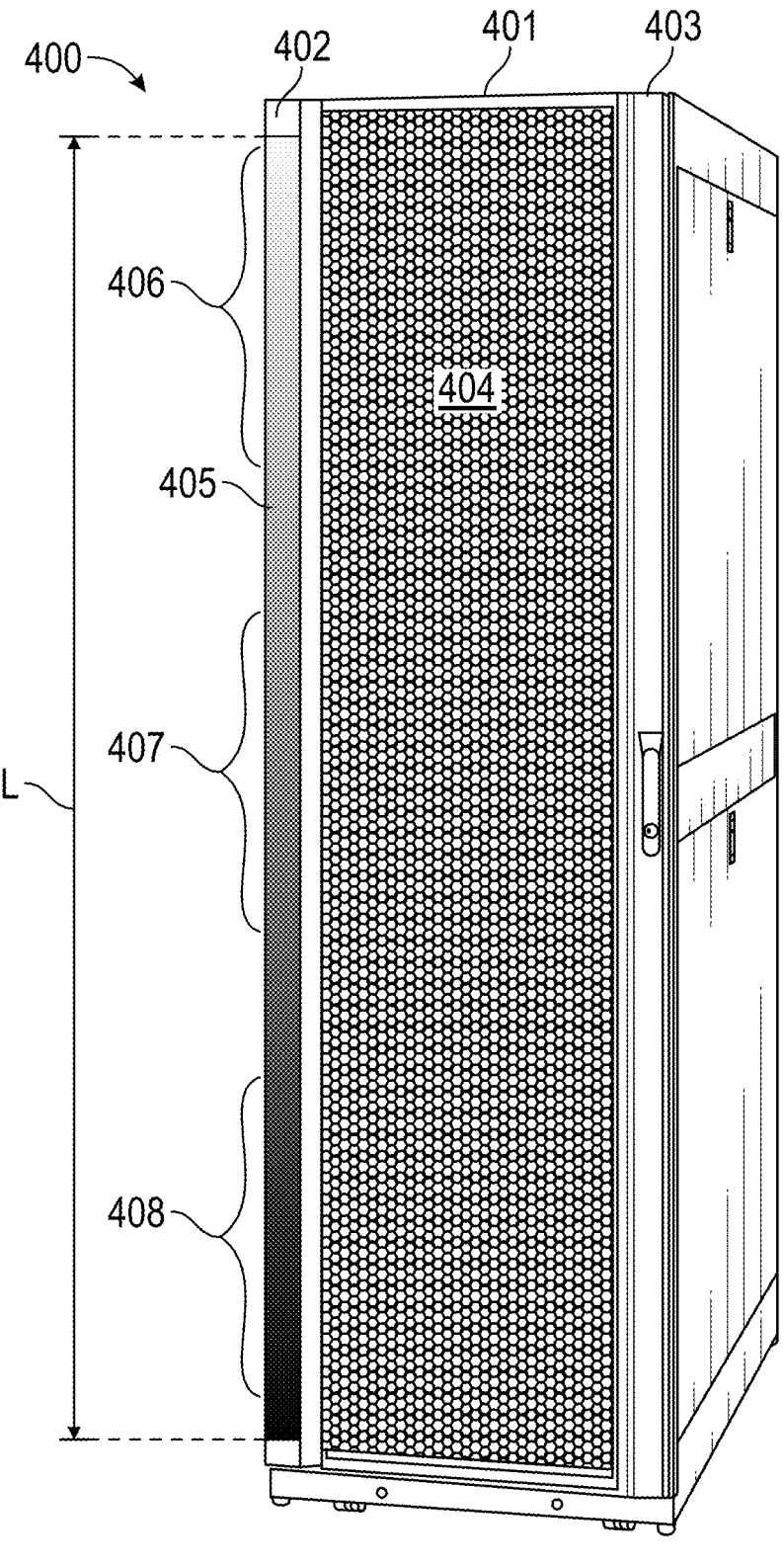
FIGS. 4A and 4B show a rack for data processing devices, such as IHSs, with a visual indication of relative ambient temperatures according to one embodiment.
Figure 4B:
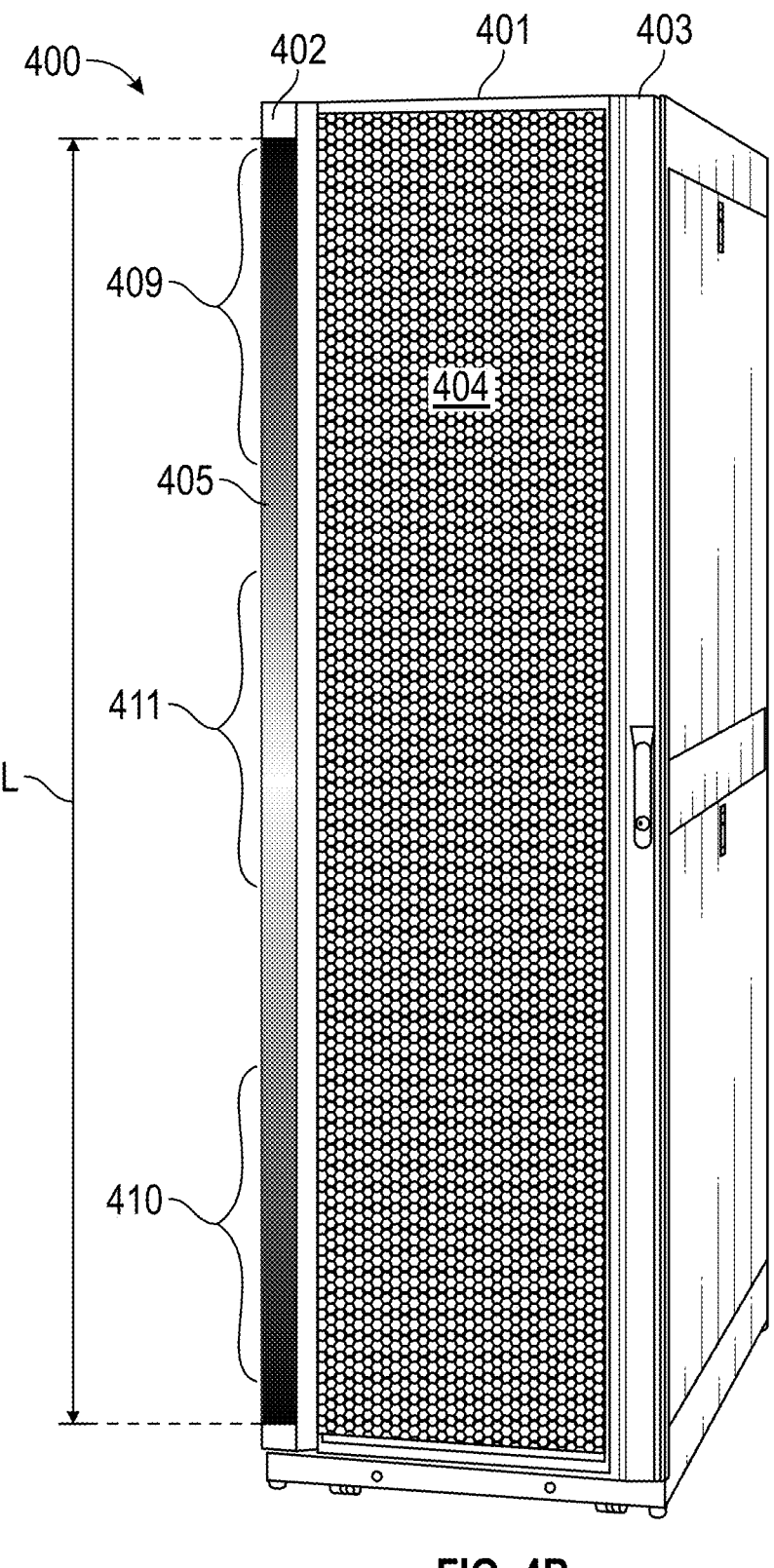

FIGS. 4A and 4B show a rack 400 for data processing devices, such as IHSs, with a visual indication of relative ambient temperatures according to one embodiment. Rack 400 has door 401 on a front side. The door 401 has a frame including a hinge side 402 and a latch side 403. Door 401 has a grille surface 404 that allows air to flow through and into rack 400. The holes or perforations on grille surface 404 may have any appropriate size, shape, and/or configuration to allow for minimal obstruction of airflow, such as a honeycomb, hexagon, diamond, square, circle, herringbone, or slot pattern. In one embodiment, an ambient temperature indicator 405 is affixed to the hinge side 402 of the door frame.

In one arrangement, ambient temperature indicator 405 includes a temperature sensitive ink or paint that is configured to react to temperature by changing color. Although shown in black-and-white in FIGS. 4A and 4B, it will be understood that ambient temperature indicator 405 may be capable of displaying any range of colors, shades, or tones that allows a user, such as a data center administrator, to visually observe changes across the length L of ambient temperature indicator 405 the rack inlet from the bottom to the top of the rack 400.

In the example shown in FIGS. 4A and 4B, lighter or brighter colors/tones on the ambient temperature indicator 405 represent relatively higher temperatures while darker colors/tones represent relatively lower temperatures. In other embodiments, the opposite may be true (i.e., darker colors/tones indicate relatively higher temperatures). In further arrangements, specific colors on the ambient temperature indicator 405 may correspond to specific temperatures or temperature ranges (e.g., "red" colors indicate warmer temperatures, and "blue" colors indicate cooler temperatures). Ideally, ambient temperature indicator 405 would be generally the same color, tone, or shade across length L to indicate a consistent temperature across door 401 has a grille surface 404.

FIG. 4A illustrates three general ranges of temperatures on the ambient temperature indicator 405. Segment 406 is generally lighter/brighter than segment 407, and segment 407 is in turn generally lighter/brighter than segment 408. This configuration of ambient temperature indicator 405 provides a visual indication that the top sections of rack 400 are warmer than the bottom sections. In some situations, this temperature display (i.e., hot on top) suggests that over-the-top recirculation is occurring for rack 400 such as illustrated in FIG. 1 airflow 112. A higher temp somewhere else might suggest another area of recirculation.

FIG. 4B illustrates another example configuration of temperature ranges on ambient temperature indicator 405 for rack 400. As illustrated in FIG. 4B, top segment 409 and bottom segment 410 are generally darker than middle segment 411, which has a lighter/brighter color. This configuration of ambient temperature indicator 405 provides a visual indication that the middle section 411 of rack 400 is warmer than the top and bottom sections (e.g., the ink or paint on ambient temperature indicator 405 takes on a lighter/brighter color, tone, or shade as temperature increases). In some situations, this temperature display (i.e., hot in an isolated section of the rack) suggests that recirculation is occurring through rack 400, such as along the side of the rack or through powered off servers in middle section 411. These types of recirculation are illustrated in FIGS. 2 and 3.

As used herein, the term "ambient temperature indicator" is intended to be broadly interpreted to include the temperature of any relevant region on a rack holding data processing devices. For example, the temperature may be associated with an air temperature of an intake (e.g., front side) or exhaust (e.g., back side) of a rack. Alternatively, the temperature may be associated with the surface temperature of a rack door, grille, door frame, side, front, or back.

Figure 5A:
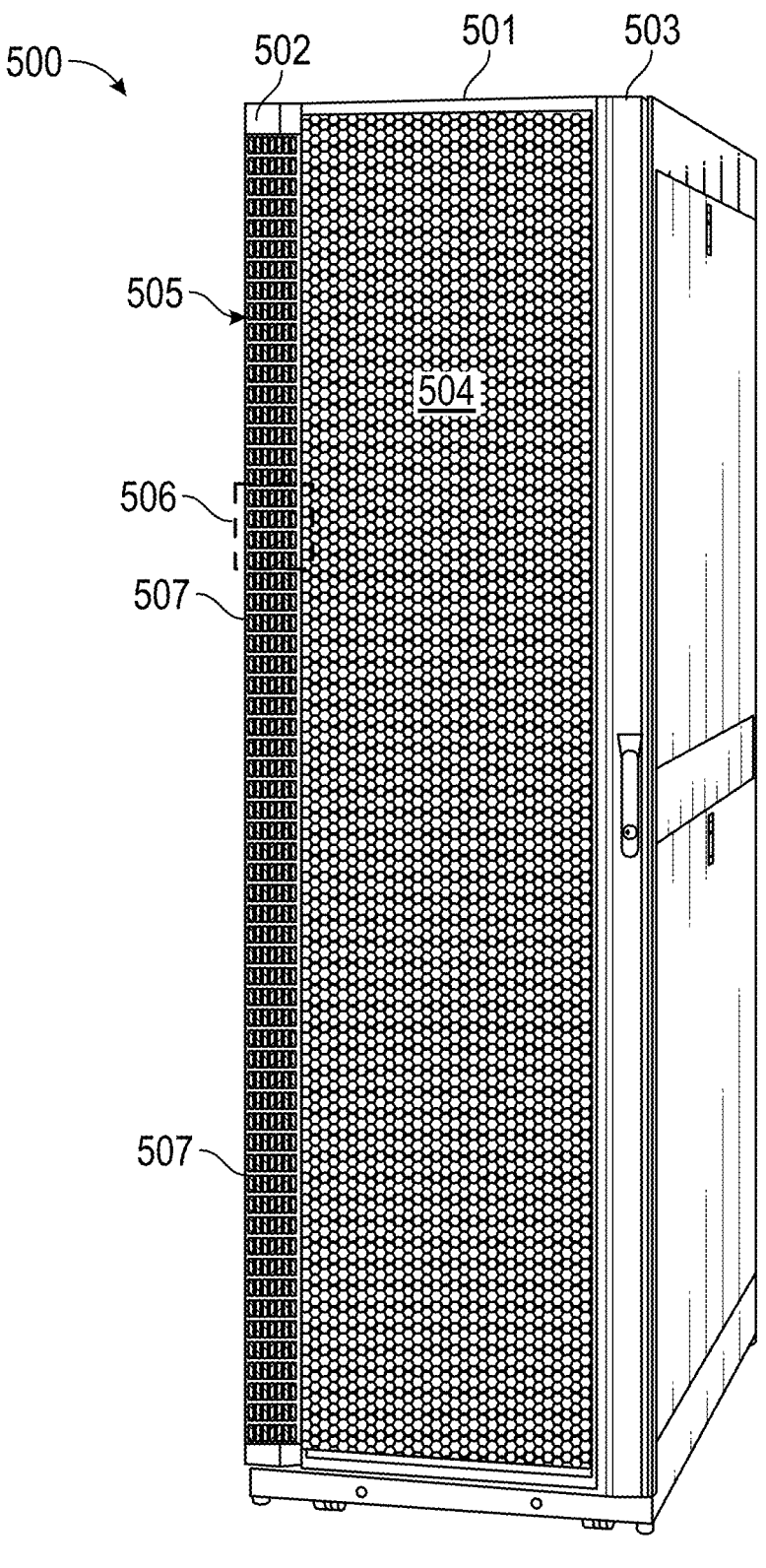
FIG. 5A shows a rack for data processing devices, such as IHSs, with a visual indication of relative ambient temperatures according to an alternative embodiment
Figure 5B:
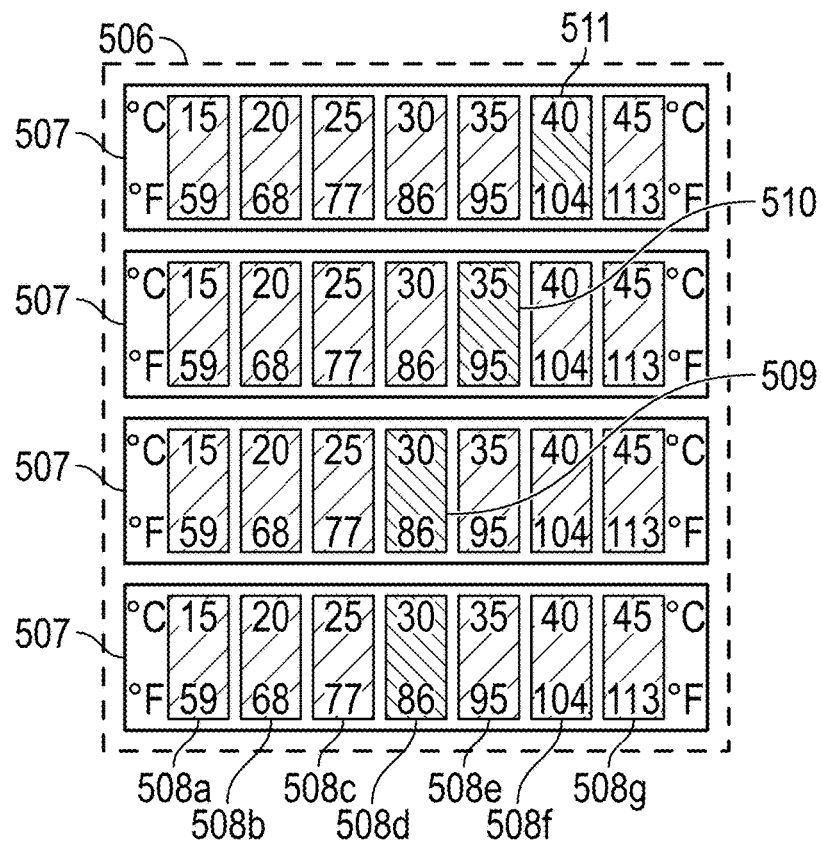
FIG. 5B is an enlarged view of a portion of the ambient temperature indicator.

FIG. 5A shows a rack 500 for data processing devices, such as IHSs, with a visual indication of relative ambient temperatures according to an alternative embodiment. Rack 500 has door 501 on a front side. The door 501 has a frame including a hinge side 502 and a latch side 503. Door 501 has a grille surface 504 that allows air to flow through and into rack 500. An ambient temperature indicator 505 is affixed to the hinge side 502 of the door frame. FIG. 5B is an enlarged view of a portion 506 of the ambient temperature indicator 505.

In an example embodiment, ambient temperature indicator 505 is an elongated strip of temperature stickers 507 that are organized in a stack from the bottom to the top of rack 500. Temperature stickers 507 may be individual components (e.g., many separate stickers) or they may be sections of a single long sticker 505. The arrangement of a continuous strip of temperature stickers or sections 507 allows a user to visually compare inlet temperatures across the front side of rack 500. As shown in FIG. 5B, each sections 507 comprises a plurality of segments 508a-g that correspond to different temperatures. The segments 508a-g correspond to temperatures separated by increments of 5° C. The individual segments 508a-g are configured to change color when the ambient temperature (i.e., the air temperature or the temperature of the rack surface) is within several degrees of the listed temperature. For example, segment 508d may change color when the ambient temperature is within ±3° C. of 30° C. segment 508e may change color when the ambient temperature is within ±3° C. of 35° C., and segment 508f may change color when the ambient temperature is within ±3° C. of 40° C. Accordingly, segments 508d and 509 are showing an ambient local temperature of 30° C., segment 510 is showing an ambient local temperature of 35° C., and segment 511 is showing an ambient local temperature of 40° C. This suggests visually that the temperature in portion 506 on ambient temperature indicator 505 is warmer in the top section compared to the bottom section. If this trend continued and showed consistently warmer temperatures in the top of the rack, then a data center administrator might evaluate the airflow around rack 500 to determine if over-the-top recirculation was occurring.

It will be understood that in other embodiments, any number of individual sections or stickers 507 may be used in ambient temperature indicator 505. In some embodiments, the sections or stickers 507 may be tightly packed so that they are adjacent or even overlapping to provide visual temperature indications every inch or half-inch. In other embodiments, the sections or stickers 507 may be spread apart to provide a visual temperature indication every three to six inches. The spacing of the sections or stickers 507 may be determined, for example, based upon the temperature sensitivity of the data processing devices or the density of the data processing device stack in rack 500.

In further embodiments, the ambient temperature indicator 505 may use different temperature ranges for the segments 508*a-g* on each section 507. The high and low end of the temperature range may be determined based on the type of data processing device stack in rack 500 and the expected operating temperatures. The spread between temperature in each segment 508*a-g* may vary depending on the sensitivity of the data processing devices to temperatures fluctuations. For example, for data processing devices that are optimized to operate within a limited temperature range, the segments 508*a-g* may be set at 1° C. increments.

Figure 6:
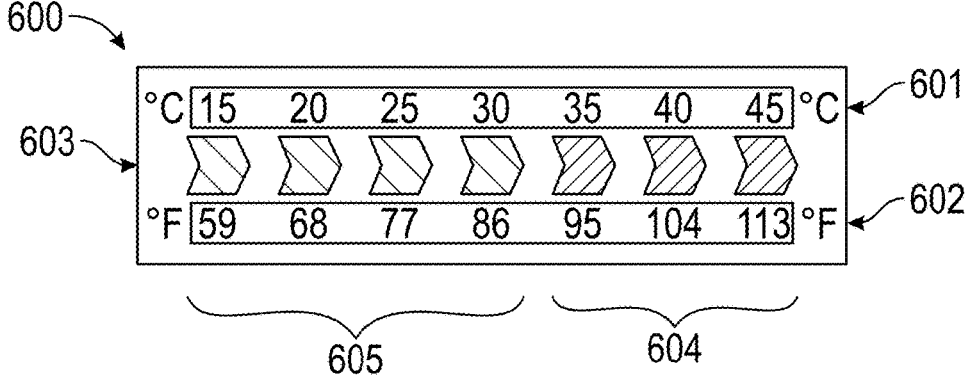
FIG. 6 illustrates one alternative section or sticker for use in an ambient temperature indicator comprising an elongated strip of temperature stickers that are organized in a stack from the bottom to the top of a rack for data processing devices.

FIG. 6 illustrates one alternative section or sticker 600 for use in an ambient temperature indicator comprising an elongated strip of temperature stickers that are organized in a stack from the bottom to the top of a rack for data processing devices. Sticker 600 lists a range of Celsius and Fahrenheit temperatures 601, 602. An indicator is associated with each listed Celsius and Fahrenheit temperature. When the temperature is at or above a listed temperature, then the associated indictor 603 changes color. The indicators 603 are printed on sticker 600 using a temperature sensitive ink or paint. For example, the indicators 603 may initially be a dark color or black (segments 604) and when the associated ambient temperature is reached, then the indicator 603 may turn a light color or white (segments 605). When a number of such stickers 600 are combined in a stack to form an ambient temperature indicator, changes in the inlet air temperature may be visually indicated based upon how many segments 603 have changed color at different heights on the rack.

Figure 7:
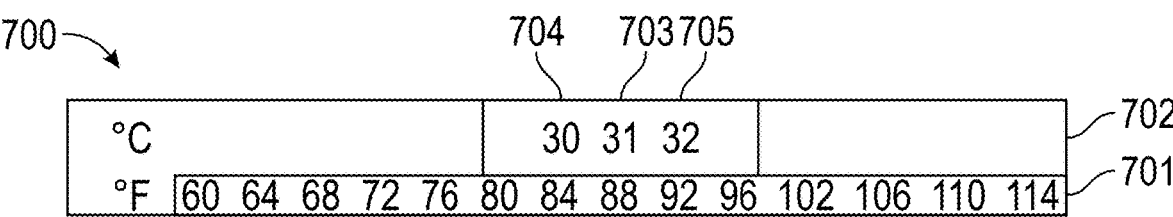
FIG. 7 illustrates another alternative section or sticker for use in an ambient temperature indicator.

FIG. 7 illustrates another alternative section or sticker 700 for use in an ambient temperature indicator. A constant list of Fahrenheit temperatures 701 are always displayed as a reference. Corresponding Celsius temperatures 702 are printed using a temperature sensitive ink or paint. A printed temperature number 702 changes color when the ambient temperature matches or is near that printed temperature. For example, when the ambient air temperature on the intake to a rack reaches 31° C., the printed numeral "31" (703) changes color. Depending on the sensitivity of the ink, nearby numerals may also change color, such as numerals "30" and "32" (704, 705). In one arrangement, the printed Celsius numerals may initially have a color that matches a background color so that the numerals blend in with the sticker background when the ambient temperature does not match. When the ambient temperature matches a printed numeral, then that numeral changes to a color contrasting with the background so that it is readily visually apparent to a user. When a number of such stickers 700 are combined in a stack to form an ambient temperature indicator, changes in the inlet air temperature may be visually indicated based upon the position of each numeral 703 that has changed color at different heights on the rack.

The example embodiments illustrated in FIGS. 4A, 4B, and 5A illustrate an ambient temperature indicator that is affixed to the hinge side frame on the outside of a front-side rack door to avoid blocking airflow. It will be understood that this location for the ambient temperature indicator is for illustration purposes only and that the ambient temperature indicator may be located in any position on the rack, such as the latch-side of a front-side door frame, on the rack door itself, on the inside of the door or frame, on or near the back-side of the rack (i.e., to indicate ambient exhaust airflow temperature), on a sidewall of a rack, and/or in any other position on a rack that is useful for a data center administrator to get a visual indication of the temperature across all or portions of a rack. The term "rack" as used herein is intended to be broadly interpreted to include any frame or structure for holding multiple data processing devices, such as IHSs or servers, whether fully or partially enclosed or unenclosed.

The example embodiments illustrated in FIGS. 5B, 6, and 7 illustrate various segments of an ambient temperature indicator. It will be understood that other displays may be use for individual segments of an ambient temperature indicator and that such displays may include Fahrenheit and/or Celsius temperature values or may not designate any specific temperature values. Moreover, individual temperature indications on the displays (e.g., 508*a-g*, 603, 703-705) may represent a specific temperature or a temperature range. The temperature ranges may relate to any appropriate interval, such as an interval of 5-10 degrees or a range that includes all temperature below a particular value.

Figure 8A:
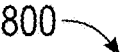
FIGS. 8A and 8B illustrate another embodiment an ambient temperature indication for a door grille.
Figure 8A:
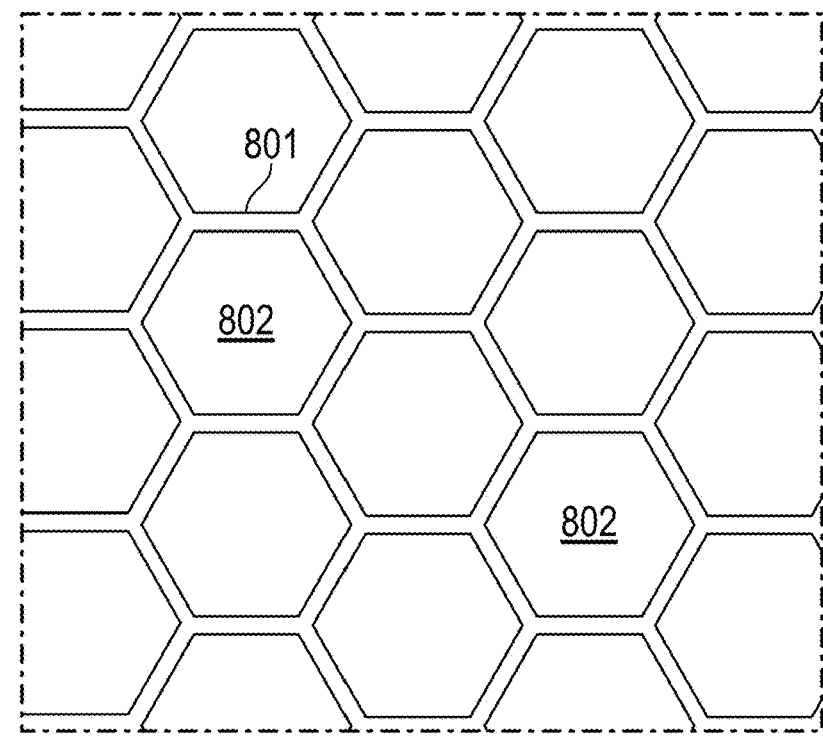
Figure 8B:
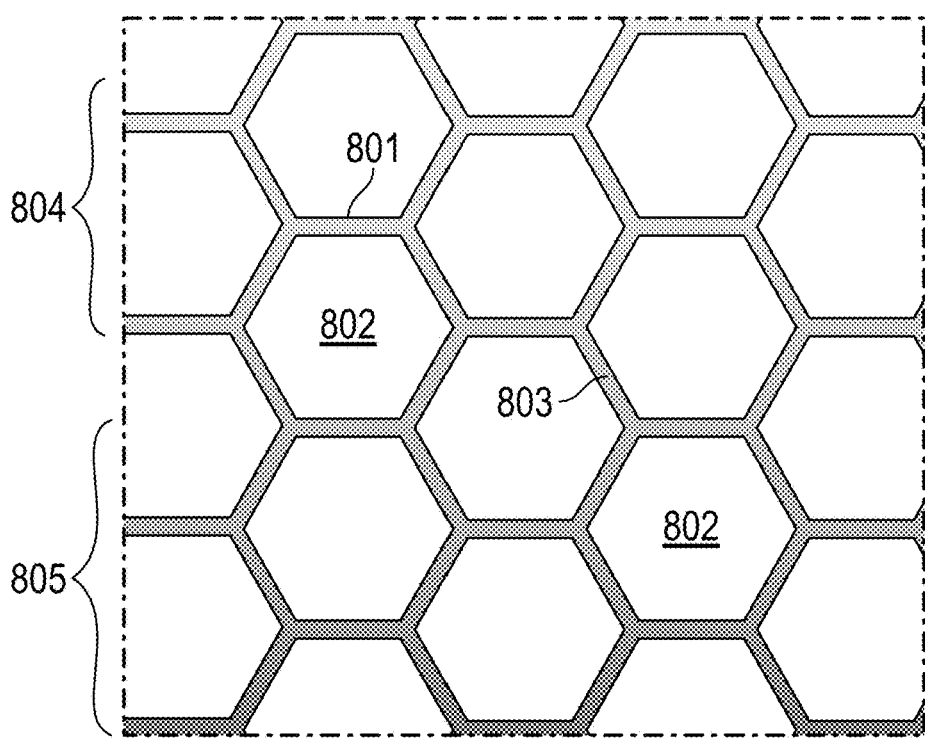

FIGS. 8A and 8B illustrate another embodiment an ambient temperature indication for a door grille. FIG. 8A shows a portion 800 of a rack door grille 801. The grille 801 has a honeycomb pattern with numerous hexagon-shaped openings 802. The grill 801 may be made of metal, plastic, or any appropriate material that allows air to flow through openings 802. As air flows across grille 801 and through openings 802, grille 801 will tend to warm up or cool down in response to the temperature of the airflow. If the airflow has a temperature differential across the surface of grille 801, then different areas of grille 801 will have different temperatures.

FIG. 8B illustrates grille 801 with a temperature-sensitive sticker 803 applied. Instead of a sticker, some other temperature-sensitive material, such as ink or paint, may be applied to grille 801. The temperature-sensitive sticker 803 is configured to change colors based upon the ambient temperature of grille 801 and/or the airflow passing though openings 802. The temperature-sensitive sticker 803 has holes that align with openings 802 to avoid blocking airflow though grille 801.

In the example shown in FIG. 8B, lighter colors/tones on the temperature-sensitive sticker 803 represent relatively higher temperatures while darker colors/tones represent relatively lower temperatures. In other embodiments, the opposite may be true (i.e., darker colors/tones indicate relatively higher temperatures). In further arrangements, specific colors on the temperature-sensitive sticker 803 may correspond to specific temperatures or temperature ranges (e.g., "red" colors indicate warmer temperatures, and "blue" colors indicate cooler temperatures). Ideally, the temperature-sensitive sticker 803 would be generally the same color, tone, or shade across its surface to indicate a consistent temperature across grille 801.

FIG. 8B illustrates a segment 804 is generally lighter/ brighter than segment 805. This configuration on the temperature-sensitive sticker 803 provides a visual indication that the top section 804 of grille 801 is warmer than the bottom section 805. In some situations, this temperature differential display (i.e., hot on top) suggests that over-the-top recirculation is occurring for the rack on which grille 801 is installed.

Since the temperature-sensitive sticker 803 may cover an entire grille 801 for a rack door, sticker 803 may provide more specific indications of temperature hot spots than are available from the ambient temperature indicators discussed in connection with FIGS. 4A-7, which provide a more linear indication of the temperature across the vertical dimension of a rack. Sticker 803 provides an indication of the rack temperature both vertically (i.e., top-to-bottom across the rack door) and horizontally (i.e., side-to-side across the rack door).

In an example embodiment, a rack assembly for physically supporting information technology (IT) devices comprises a plurality of interconnected panels forming a volumetric space having a front access and a rear access with opposing side panels. The front access and the rear access extending from a bottom edge to a top edge of an opening, which may be the edges of a frame, door, vent, or grille, for example. The plurality of interconnected panels allow air to flow in either direction between the front access and the rear access. A plurality of data processing devices may be stacked within the volumetric space and may use the airflow for cooling. An ambient temperature indicator may be mounted adjacent to the front access and/or the rear access. The ambient temperature indicator may be configured to visually indicate temperature values between the top edge and the bottom edge. The temperature values may correspond to a temperature of air flowing past the ambient temperature indicator, air flowing into the rack assembly, air flowing out of the rack assembly, a rack assembly surface temperature, or any other appropriate temperature associated with the rack, data processing devices stored in the rack, or the airflow through and around the rack.

The rack assembly may further comprise a door frame adjacent to the front access with a door mounted in the door frame. The door may include a vented grille that is configured to allow the air to flow through the door. The ambient temperature indicator may be mounted to the door frame. Alternatively, the ambient temperature indicator may be mounted on a side panel.

The ambient temperature indicator may comprise a temperature-sensitive ink or paint.

The ambient temperature indicator may comprise a sticker that is affixed to the rack assembly.

The ambient temperature indicator may comprise a plurality of individual stickers stacked from the bottom edge to the top edge, such as the edges of an opening to the rack. Each individual sticker may be configured to react to temperature by displaying indicia associated with a temperature or temperature range. The indicia may be a range of colors, shades, or tones associated with various temperatures or temperature ranges. The indicia may include a series of segments that change color at different temperatures. The indicia may be numerical values that are associated with particular temperatures or temperature ranges.

The ambient temperature indicator may comprise a continuous band of temperature-sensitive ink or paint extending from the bottom edge to the top edge. Localized regions of the ambient temperature indicator change colors based upon the temperature in each region. For example, the localized regions may indicate temperature for a region that is approximately one-half inch, one inch, six inches, or twelve inches high. The size of the region may depend, for example, on the sensitivity of the temperature-sensitive ink or paint.

In another embodiment, a rack assembly for physically supporting information technology devices comprises a plurality of interconnected panels forming a volumetric space having a front access and a rear access with opposing side panels. The front access and the rear access extend from a bottom edge to a top edge. A door is mounted in the front access. The door includes a vented grille configured to allow the air to flow through the door and into the volumetric space. An ambient temperature indicator is mounted on the vented grille. The ambient temperature indicator is configured to visually indicate temperature values between the top edge and the bottom edge. The ambient temperature indicator may be a sticker that is affixed to the vented grille. The sticker includes a plurality of holes that are configured to align with holes in the vented grille. The sticker includes a temperature-sensitive ink or paint that changes color, shade, or tone at different temperatures. Alternatively, the ambient temperature indicator may comprise a temperature-sensitive ink or paint that is applied to the vented grille, wherein localized regions of the change colors based upon the temperature in each region of the vented grille.

It should be understood that various operations described herein may be implemented in software executed by logic or processing circuitry, hardware, or a combination thereof. The order in which each operation of a given method is performed may be changed, and various operations may be added, reordered, combined, omitted, modified, etc. It is intended that the invention(s) described herein embrace all such modifications and changes and, accordingly, the above description should be regarded in an illustrative rather than a restrictive sense.

Although the invention(s) is/are described herein with reference to specific embodiments, various modifications and changes can be made without departing from the scope of the present invention(s), as set forth in the claims below. Accordingly, the specification and figures are to be regarded in an illustrative rather than a restrictive sense, and all such modifications are intended to be included within the scope of the present invention(s). Any benefits, advantages, or solutions to problems that are described herein with regard to specific embodiments are not intended to be construed as a critical, required, or essential feature or element of any or all the claims.

Unless stated otherwise, terms such as "first" and "second" are used to arbitrarily distinguish between the elements such terms describe. Thus, these terms are not necessarily intended to indicate temporal or other prioritization of such elements. The terms "coupled" or "operably coupled" are defined as connected, although not necessarily directly, and not necessarily mechanically. The terms "a" and "an" are defined as one or more unless stated otherwise. The terms "comprise" (and any form of comprise, such as "comprises" and "comprising"), "have" (and any form of have, such as "has" and "having"), "include" (and any form of include, such as "includes" and "including") and "contain" (and any form of contain, such as "contains" and "containing") are open-ended linking verbs. As a result, a system, device, or apparatus that "comprises," "has," "includes" or "contains" one or more elements possesses those one or more elements but is not limited to possessing only those one or more elements. Similarly, a method or process that "comprises," "has," "includes" or "contains" one or more operations possesses those one or more operations but is not limited to possessing only those one or more operations.

What is claimed is:

1. A rack assembly comprising:

a plurality of interconnected panels that form a volumetric space which has a front access and a rear access with opposite side panels, wherein the front access and the rear access extend from a bottom edge to a top edge;

a door mounted in the front access, wherein the door comprises a vented grille configured to allow air to flow through the door and into the volumetric space; and an ambient temperature indicator comprising a sticker mounted to a hinge-side portion of the door, the ambient temperature indicator configured to visually indicate values of air temperatures between the top edge and the bottom edge, wherein the sticker comprises a temperature-sensitive ink or paint that changes color, shade, or tone at different temperatures and a plurality of holes in the sticker configured to align with holes in the vented grille.

2. The rack assembly of claim 1, wherein the ambient temperature indicator further comprises a continuous band of temperature-sensitive ink or paint.

3. The rack assembly of claim 2, wherein the continuous band of temperature-sensitive ink or paint extends from the bottom edge to the top edge.

4. The rack assembly of claim 1, wherein the ambient temperature indicator further comprises localized regions configured to change color based upon temperature in each localized region, to enable visual detection of localized airflow anomalies.

5. The rack assembly of claim 4, wherein temperature in each localized region corresponds to a temperature of air flow into the rack assembly.

6. The rack assembly of claim 4, wherein temperature in each localized region corresponds to a temperature of air flow out of the rack assembly.

7. The rack assembly of claim 1, wherein the rack assembly further comprises the ambient temperature indicator mounted adjacent to the vented grille, wherein the vented grill has a vented grille side edge parallel to a length of the vented grille.

8. A method to make a rack assembly, the method comprising:

interconnecting a plurality of panels to form a volumetric space which has a front access and a rear access with opposite side panels, wherein the front access and the rear access extend from a bottom edge to a top edge;

mounting a door in the front access, wherein the door comprises a vented grille configured to allow air to flow through the door and into the volumetric space; and mounting an ambient temperature indicator comprising a sticker to a hinge-side portion of the door, the ambient temperature indicator configured to visually indicate values of air temperatures between the top edge and the bottom edge, wherein the sticker comprises a temperature-sensitive ink or paint that changes color, shade, or tone at different temperatures and a plurality of holes in the sticker configured to align with holes in the vented grille.

9. The method of claim 8, wherein the method further comprises configuring the ambient temperature indicator with a continuous band of temperature-sensitive ink or paint.

10. The method of claim 9, wherein the method further comprises extending the continuous band of temperature-sensitive ink or paint from the bottom edge to the top edge.

11. The method of claim 8, wherein the method further comprises configuring the ambient temperature indicator with localized regions configured to change color based upon temperature in each localized region, to enable visual detection of localized airflow anomalies.

12. The method of claim 11, wherein the method further comprises configuring temperature in each localized region to correspond to a temperature of air flow into the rack assembly.

13. The method of claim 11, wherein the method further comprises configuring temperature in each localized region to correspond to a temperature of air flow out of the rack assembly.

14. The method of claim 8, wherein the method further comprises mounting the ambient temperature indicator adjacent to the vented grille, wherein the vented grill has a vented grille side edge parallel to a length of the vented grille.

15. A rack assembly kit comprising:

a plurality of interconnectable panels configured to form a volumetric space which has a front access and a rear access with opposite side panels, wherein the front access and the rear access extend from a bottom edge to a top edge;

a door configured to be mounted in the front access, wherein the door comprises a vented grille configured to allow air to flow through the door and into the volumetric space; and an ambient temperature indicator comprising a sticker configured to be mounted to a hinge-side portion of the door, the ambient temperature indicator configured to visually indicate values of air temperatures between the top edge and the bottom edge, wherein the sticker comprises a temperature-sensitive ink or paint that changes color, shade, or tone at different temperatures and a plurality of holes in the sticker configured to align with holes in the vented grille.

* * * * *